United States Patent [19]

Miyazaki

[11] Patent Number: 5,648,977
[45] Date of Patent: Jul. 15, 1997

[54] LASER ARRAY DEVICE AND METHOD OF FABRICATING THE DEVICE

[75] Inventor: Yasunori Miyazaki, Tokyo, Japan

[73] Assignee: Mitsubishi Denki Kabushiki Kaisha, Tokyo, Japan

[21] Appl. No.: 541,298

[22] Filed: Oct. 10, 1995

[30] Foreign Application Priority Data

Oct. 11, 1994 [JP] Japan ................... 6-245442

[51] Int. Cl.$^6$ ................... H01S 3/04; H01S 3/00; H01L 33/00
[52] U.S. Cl. ................... 372/36; 372/109; 257/88; 257/98
[58] Field of Search ................... 372/43, 50, 34, 372/35, 36, 109, 44; 257/88, 91, 98, 99

[56] References Cited

U.S. PATENT DOCUMENTS

| | | | |
|---|---|---|---|
| 4,901,325 | 2/1990 | Kato et al. | 372/44 |
| 5,355,382 | 10/1994 | Kovacs et al. | 372/50 |

*Primary Examiner*—Rodney B. Bovernick
*Assistant Examiner*—Luong-Quyen Phan
*Attorney, Agent, or Firm*—Leydig, Voit & Mayer

[57] ABSTRACT

An array type semiconductor laser device includes a foldable submount and a plurality of semiconductor lasers each having uppermost and lowermost layers mounted on the submount. The submount is folded into a polygonal shape having sides with a respective semiconductor laser mounted in the polygon on a corresponding side of the polygon. Therefore, it is easy to mount the semiconductor lasers and a light source can be concentrated on a narrow region.

17 Claims, 5 Drawing Sheets

5,648,977

LASER ARRAY DEVICE AND METHOD OF FABRICATING THE DEVICE

FIELD OF THE INVENTION

The present invention relates to an array type semiconductor laser device and a method of fabricating the array type semiconductor laser device. More particularly, the invention relates to an array type semiconductor laser device that can concentrate light emitting points on a narrow region and that is easy to mount, and a fabricating method.

BACKGROUND OF THE INVENTION

FIGS. 8(a) and 8(b) are views illustrating prior art array type semiconductor laser devices.

In the array type semiconductor laser device shown in FIG. 8(a), reference numeral 3000 designates a submount, and a semiconductor laser array body 1000 is mounted on the submount 3000. Each semiconductor laser constituting the semiconductor laser array includes an active layer 2000.

In the array type semiconductor laser device shown in FIG. 8(b), reference numeral 6000 designates a submount, and a plurality of semiconductor laser bodies, five laser bodies in this case, 4000 are mounted vertically on the submount 6000. Each semiconductor laser body 4000 includes an active layer 5000. The semiconductor laser body 4000 and the submount 6000, and the semiconductor laser bodies 4000 are adhered to each other with solder.

The prior art array type semiconductor laser devices have structures as described above. For example, in the prior device shown in FIG. 8(a), since a region R1, a light emitting region including the active layers, is extended in proportion to the number of the semiconductor laser bodies, light cannot be concentrated on a narrow region.

In addition, in the prior device shown in FIG. 8(b), a region R2 serving as a light emitting region of the semiconductor laser device can be made narrower than the region R1 shown in FIG. 8(a). However, when the semiconductor laser body 4000 and the submount 6000, and the semiconductor laser bodies 4000 are adhered to each other with solder, a method of successively adhering using a plurality of solders having the different melting points is used in order not to melt the adhered portions again due to the following soldering. Therefore, more kinds of solder which are used for adhering are required as the number of the semiconductor laser bodies increases, whereby the damage due to the heat in the adhering process is made worse. In addition, since each element is small, it is difficult to mount the elements, whereby the slippage of the elements in an optical axis direction is caused when the semiconductor laser bodies are laminated.

Further, when the prior art array type semiconductor laser devices shown in FIGS. 8(a) and 8(b) are used as a light source of a radar which is mounted on an automobile or the like and is used for perceiving obstacles, higher density and higher output of the respective semiconductor lasers are required. For example, a current value of about 100 mA which is usually used in the array type semiconductor laser device needs to be increased to about 10 A though it is pulsed. In this time, in the prior device shown in FIG. 8(a), for example, when a current which is supplied to one semiconductor laser is 100 mA, more current is required depending upon the number of the semiconductor lasers. Therefore, if the power source can not supply all of the required current, the array type semiconductor laser device does not operate.

In the prior device shown in FIG. 8(b), for example, when a voltage applied to one semiconductor laser is 2 V, it is required that the voltage be increased for the number of the semiconductor lasers since it is applied to the whole array type semiconductor laser device. Therefore, if the power source can not supply all of the required voltage, the array type semiconductor laser device does not operate.

SUMMARY OF THE INVENTION

An object of the present invention is to provide an array type semiconductor laser device that can concentrate light emitting points in a narrow region in an easy mounting process and that can be used without a limit on the power supply, and a fabricating method.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, an array type semiconductor laser device comprises mounting a plurality of semiconductor lasers on a submount which can be folded before folded, and folding the foldable submount so that the mounted semiconductor lasers are positioned inside. Therefore, it is easy to mount the semiconductor lasers and a light source can be concentrated on a narrow region.

According to a second aspect of the present invention, in the above-described array type semiconductor laser device, the semiconductor laser has a front surface electrode over the entire surface of the uppermost layer and a rear surface electrode over the lowermost layer and has a structure in which a current flows in a direction perpendicular to the surface of the submount. Therefore, a current can be supplied in parallel to a plurality of semiconductor lasers.

According to a third aspect of the present invention, in the above-described array type semiconductor laser device, the submount is folded so that all front surface electrodes of the respective semiconductor lasers touch internally one columnar electrode. Therefore, it is easy to perform wiring.

According to a fourth aspect of the present invention, in the above-described array type semiconductor laser device, the front surface electrodes of the semiconductor lasers are adhered to the columnar electrode by raising the temperature and alloying these. Therefore, the electrical connection between the front surface electrodes and the columnar electrode can be made more reliable.

According to a fifth aspect of the present invention, in the above-described array type semiconductor laser device, the submount is folded so that all front surface electrodes of the semiconductor lasers are in contact with a conductive ball to which a wiring is connected. Therefore, it is easy to perform wiring.

According to a sixth aspect of the present invention, in the above-described array type semiconductor laser device, the submount is folded so that the facing end portions of the front surface electrodes of the adjacent semiconductor lasers are connected to each other through each conductive ball, and a wiring is connected to one of the conductive balls. Therefore, it is easy to perform wiring.

According to a seventh aspect of the present invention, in the above-described array type semiconductor laser device, the submount is folded so that the facing front surface electrodes of the adjacent semiconductor lasers are connected directly to each other. Therefore, it is easy to perform wiring.

According to an eighth aspect of the present invention, in the above-described array type semiconductor laser device, the semiconductor laser has positive and negative front surface electrodes at both ends of the uppermost layer and has a structure in which a current flows in a direction parallel to the surface of the submount. Therefore, a current can be supplied in series to a plurality of semiconductor lasers.

According to a ninth aspect of the present invention, in the above-described array type semiconductor laser device, the semiconductor lasers are disposed so that the polarity of the facing front surface electrodes of the adjacent semiconductor lasers are different from each other in the state before the submount is folded, wirings are connected respectively to the two front surface electrodes of the semiconductor lasers disposed at both ends of the submount and having the different polarity, and the submount is folded so that the facing front surface electrodes of the adjacent semiconductor lasers are connected to each other through each conductive ball and the two front surface electrodes to which the wirings are connected are not short-circuited each other. Therefore, it is easy to perform wiring.

According to a tenth aspect of the present invention, in the above-described array type semiconductor laser device, the semiconductor lasers are disposed so that the polarity of the facing front surface electrodes of the adjacent semiconductor lasers are different from each other in the state before the submount is folded, wirings are connected respectively to the two front surface electrodes of the semiconductor lasers disposed at both ends of the submount and having the different polarity, and the submount is folded so that the facing front surface electrodes of the adjacent semiconductor lasers are connected directly to each other and the two front surface electrodes to which the wirings are connected are not short-circuited each other. Therefore, it is easy to perform wiring.

According to an eleventh aspect of the present invention, in the above-described array type semiconductor laser device, since the plurality of semiconductor lasers comprise three or more semiconductor lasers, more light quantity can be obtained.

According to a twelfth aspect of the present invention, a method of fabricating an array type semiconductor laser device includes preparing a plurality of semiconductor lasers each having a front surface electrode over the entire surface of the uppermost layer and having a structure in which a current flows in a direction perpendicular to a surface of a submount, mounting the semiconductor lasers on the submount which can be folded before it is folded, folding the submount so that all front surface electrodes of the respective semiconductor lasers touch internally one columnar electrode which is insulated from a stem, adhering both ends of the folded submount to each other, and adhering the submount of which both ends are adhered to the stem. Therefore, a light source can be concentrated on a narrow region by an easy mounting process even when the number of the semiconductor lasers increases, and a current can be supplied in parallel to the semiconductor lasers.

According to a thirteenth aspect of the present invention, a method of fabricating an array type semiconductor laser device includes preparing a plurality of semiconductor lasers each having a front surface electrode over the entire surface of the uppermost layer and having a structure in which a current flows in a direction perpendicular to a surface of a submount, mounting the semiconductor lasers on the submount which can be folded before it is folded, folding the submount so that all front surface electrodes of the respective semiconductor lasers touch internally a conductive ball to which a wiring is connected, adhering both ends of the folded submount to each other, connecting the wiring to a leading electrode, and adhering the submount of which both ends are adhered to a stem. Therefore, a light source can be concentrated on a narrow region by an easy mounting process even when the number of the semiconductor lasers increases, and a current can be supplied in parallel to the semiconductor lasers.

According to a fourteenth aspect of the present invention, a method of fabricating an array type semiconductor laser device includes preparing a plurality of semiconductor lasers each having a front surface electrode over the entire surface of the uppermost layer and having a structure in which a current flows in a direction perpendicular to a surface of a submount, mounting the semiconductor lasers on the submount which can be folded before it is folded, bonding each conductive ball to either of the end portions of the front surface electrodes adjacent when the submount is to be folded and connecting a wiring to one of the conductive balls, folding the submount so that the end portions of the facing front surface electrodes of the adjacent semiconductor lasers are connected to each other through each conductive ball, adhering both ends of the folded submount to each other, connecting the wiring to a leading electrode, and adhering the submount of which both ends are adhered to a stem. Therefore, a light source can be concentrated on a narrow region by an easy mounting process even when the number of the semiconductor lasers increases, and a current can be supplied in parallel to the semiconductor lasers.

According to a fifteenth aspect of the present invention, a method of fabricating an array type semiconductor laser device includes preparing a plurality of semiconductor lasers each having a front surface electrode over the entire surface of the uppermost layer and having a different from each other, bonding each conductive ball to either of the facing front surface electrodes and connecting wirings to two front surface electrodes which are at both ends of the submount before being folded, folding the submount so that the facing front surface electrodes are connected to each other through each conductive ball and the two front surface electrodes to which the wirings are connected are not short-circuited each other, adhering both ends of the folded submount to each other, connecting the wirings to leading electrodes, and adhering the submount of which both ends are adhered to a stem. Therefore, a light source can be concentrated on a narrow region by an easy mounting process even when the number of the semiconductor lasers increases, and a current can be supplied in series to the semiconductor lasers.

According to a seventeenth aspect of the present invention, a method of fabricating an array type semiconductor laser device includes preparing a plurality of semiconductor lasers each having positive and negative front surface electrodes at both ends of the uppermost layer and having a structure in which a current flows in a direction parallel to a surface of a submount, mounting the semiconductor lasers on the submount which can be folded before it is folded so that the polarity of the facing front structure in which a current flows in a direction perpendicular to a surface of a submount, mounting the semiconductor lasers on the submount which can be folded before it is folded, connecting a wiring to one of the front surface electrodes of the semiconductor lasers, folding the submount so that the adjacent front surface electrodes of the semiconductor lasers are connected directly to each other, adhering both ends of the folded submount to each other, connecting the wiring to a leading electrode, and adhering the submount of which both ends are adhered to a stem. Therefore, a light source can be concentrated on a narrow region by an easy mounting process even when the number of the semiconductor lasers increases, and a current can be supplied in parallel to the semiconductor lasers.

According to a sixteenth aspect of the present invention, a method of fabricating an array type semiconductor laser device includes preparing a plurality of semiconductor lasers each having positive and negative front surface electrodes at both ends of the uppermost layer and having a structure in which a current flows in a direction parallel to a surface of a submount, mounting the semiconductor lasers on the submount which can be folded before it is folded so that the polarity of the facing front surface electrodes of the adjacent semiconductor lasers are surface electrodes of the adjacent semiconductor lasers are different from each other, connecting wirings to two front surface electrodes which are at both ends of the submount before being folded, folding the submount so that the facing front surface electrodes of the semiconductor lasers are connected directly to each other and the two front surface electrodes to which the wirings are connected are not short-circuited each other, adhering both ends of the folded submount to each other, connecting the wirings to leading electrodes, and adhering the submount of which both ends are adhered to a stem. Therefore, a light source can be concentrated on a narrow region by an easy mounting process even when the number of the semiconductor lasers increases, and a current can be supplied in series to the semiconductor lasers.

BRIEF DESCRIPTION OF THE DRAWINGS

FIGS. (a) and 1(b) are sectional views illustrating process steps in a method of fabricating an array type semiconductor laser device in accordance with a first embodiment of the present invention.

DETAILED DESCRIPTION OF THE PREFERRED EMBODIMENT

[Embodiment 1]

A description is given of a first embodiment of the present invention.

Figure 1:
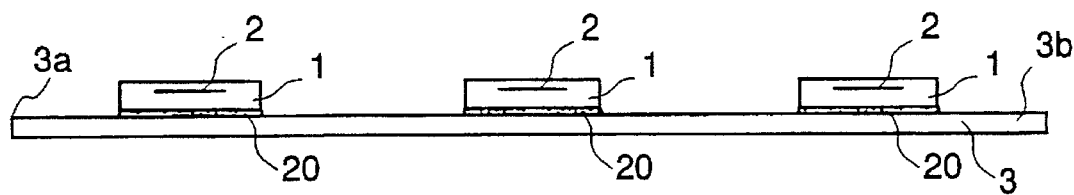
Figure 1:
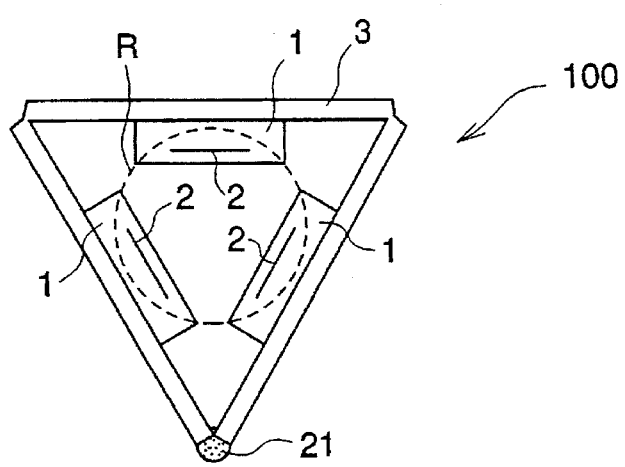

FIGS. 1(a) and 1(b) are sectional views illustrating process steps during fabricating an array type semiconductor laser device according to the first embodiment of the invention. FIG. 1(b) shows the folded state of a submount shown in FIG. 1(a) on which semiconductor laser bodies are mounted.

In FIGS. 1(a) and 1(b), reference numeral 3 designates a submount. A semiconductor laser body 1 has a front surface electrode over an entire surface of an uppermost layer, and has a structure in which current flows in a direction perpendicular to the surface of the submount 3. An active layer 2 serves as a light emitting region of each semiconductor laser body 1.

A description is given of the fabricating method.

Initially, as shown in FIG. 1(a), three semiconductor laser bodies 1 are adhered to respective positions on a submount 3 comprising an FeNi alloy capable of being folded before it is folded using AuSi alloy solder 20 having the melting point of 380° to 410°. Light from the semiconductor lasers is emitted in a direction perpendicular to the surface of the submount 3 on which the laser bodies 1 are mounted.

Next, the submount 3 is folded at two locations into a three sided figure with the surface on which the semiconductor laser bodies 1 inside. The ends 3a and 3b of the submount 3 are adhered to each other with an AuSn alloy solder 21 having a melting point of 240° to 340°.

In this case, the semiconductor laser bodies 1 must be mounted so they do not collide with each other when the submount 3 is folded. For that purpose, for example, when each semiconductor laser body 1 is 300 μm wide and 100 μm thick and the width of the submount 3 is over 1.95 mm, it is proper that the centers of the semiconductor laser bodies 1 are respectively disposed at positions of ⅙, ½, and ⅚ of the submount 3 from one end of the submount 3, respectively.

Then, wires (not shown) are connected to the electrodes of the respective laser bodies 1 in an array type semiconductor laser 100 which is formed into a triangular prism shape as described above and, as occasion demands, a cover (not shown) including a spherical lens is fitted to the array type laser 100, thereby completing an array type semiconductor laser device.

A description is given of the function.

Figure 8:
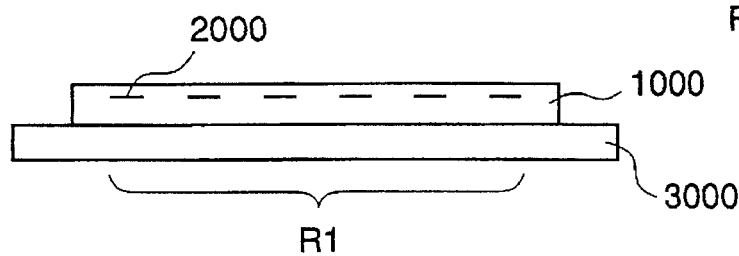
FIGS. 8(a) and 8(b) are views illustrating array type semiconductor laser devices of the prior art.
Figure 8:
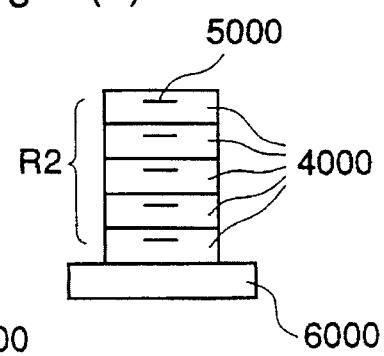

Laser light advancing in the active layers 2 of the respective semiconductor laser bodies 1 of the array type semiconductor laser device is emitted in a direction perpendicular to FIGS. 1(a) and 1(b). In this first embodiment of the invention, however, since the active layers 2 of the respective semiconductor laser bodies 1 are disposed on the sides of an equilaterial triangular, the laser light emitted from the three semiconductor laser bodies 1 can be concentrated into a circle of a region R. That is, the light emitting region of this array type semiconductor laser device as a whole is the circular region R including three active layers 2, shown in FIG. 1(b). Therefore, in the array type semiconductor laser device of the first embodiment, the emitted laser light can be concentrated in a narrow region. Also, unlike the prior device shown in FIG. 8(b) in which the laser bodies 1 are laminated vertically, the semiconductor laser bodies 1 can be electrically connected in parallel, resulting in the array type semiconductor laser device without a limit of the supply voltage. Further, since the laser bodies 1 are not vertically laminated but are disposed on the sides of the polygon, even when the number of the semiconductor laser bodies 1 increases, it is not necessary to increase the kinds of solder in the fabricating process as when the laser bodies 1 are laminated vertically.

As described above, in the array type semiconductor laser device according to the first embodiment of the invention, a plurality of semiconductor lasers 1 are mounted on the submount 3 which can be folded, the submount 3 is folded with the semiconductor laser bodies 1 inside, and both ends of the folded submount 3 are adhered to each other. Therefore, as compared with the prior art device shown in FIG. 8(a) in which the laser bodies 1 are aligned transversely, the light emitting region can be small. In addition, as compared with the prior device shown in FIG. 8(b) in which in which the laser bodies 1 are laminated vertically, it is not necessary to increase the kinds of solder in the fabricating process even when the number of the semiconductor laser bodies 1 increases, and slippage of the elements in an optical axis direction which is caused when the semiconductor laser bodies 1 are laminated and damage due to the heat in the adhering process can be reduced. Further, in this first embodiment of the invention, the semiconductor laser bodies 1 can be electrically connected in parallel, resulting in the array type semiconductor laser device without a limit of the supply voltage.

[Embodiment 2]

A description is given of a second embodiment of the present invention.

Figure 2:
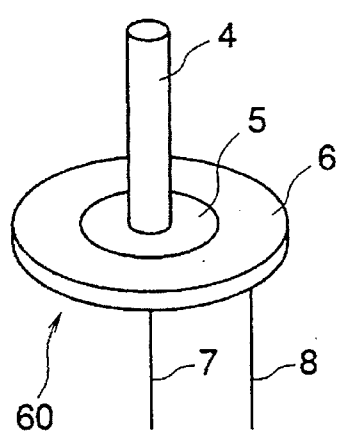
FIGS. 2(a) is a perspective view illustrating a columnar electrode and FIGS. 2(b) and 2(c) are a sectional view and a perspective view, respectively, illustrating an array type semiconductor laser device including the columnar electrode, in accordance with a second embodiment of the present invention.
Figure 2:
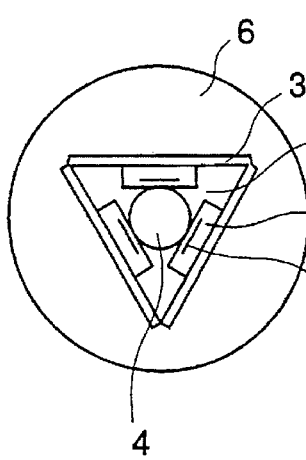
Figure 2:
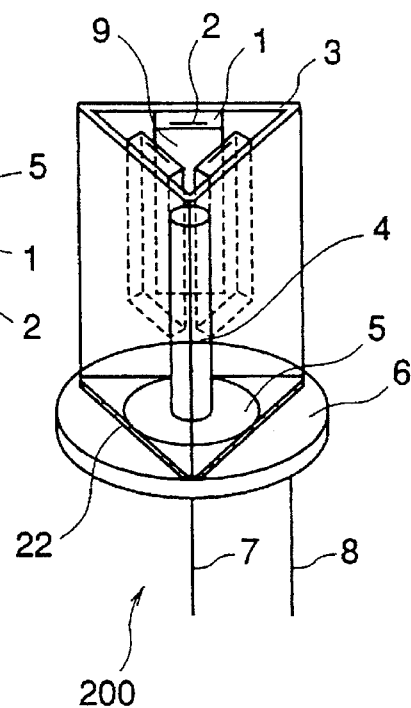

FIG. 2(a) is a perspective view illustrating a stem with a columnar electrode in an array type semiconductor laser device according to the second embodiment of the invention. FIGS. 2(b) and 2(c) are respectively a sectional view and a perspective view illustrating an array type semiconductor laser device according to the second embodiment of the invention in which the semiconductor laser device according to the first embodiment is fixed to the stem with the columnar electrode shown in FIG. 2(a).

In FIGS. 2(a)–2(c), a columnar electrode 4 comprising such as CuW has an appropriate cross-sectional shape and is shorter than the submount 3 by about 1 mm. In this second embodiment of the invention, the section of the columnar electrode 4 has a round shape. An insulator 5 comprising $Al_2O_3$ insulates the columnar electrode 4 from a stem 6. An electrode 7 is connected to the columnar electrode 4, an electrode 8 is connected to the stem 6, and front surface electrodes 9 are formed over the entire surfaces of the uppermost layers of the semiconductor laser bodies 1.

In the array type semiconductor laser device of the second embodiment, the power source is supplied to the array type laser device of the first embodiment, using the stem 60 with the columnar electrode having a round section shown in FIG. 2(a). The radius r of the columnar electrode 4 is determined as follows.

As shown in FIGS. 2(b) and 2(c), when three semiconductor laser bodies 1 are mounted on the submount 3, the radius r of the round section of the columnar electrode 4 is represented by $$r = (L/2 \sqrt{3}) - d \qquad (1)$$

where L is the length of a side of a triangle which is formed by the submount 3 and d is a thickness of each semiconductor laser body 1. Assuming that the semiconductor laser body 1 is 300 μm wide and 100 μm high and the width of the submount 3 is 2.4 mm, the diameter 2r of the columnar electrode 4 is 260 μm according to by the formula (1). In this structure, the emitted laser light of the array type semiconductor laser device can be concentrated into the circle of the region R shown in FIG. 1(b). In addition, after the determination of the radius of the columnar electrode 4, the length 3L of the submount 3 may be determined by the formula (1).

A description is given of the fabricating method.

After the sizes of the submount 3, the semiconductor laser body 1, and the like are determined as described above, the array type semiconductor laser 100 of the first embodiment is fabricated by the method described in the first embodiment.

Then, the stem 60 with the columnar electrode comprising the columnar electrode 4 and the stem 6 is inserted into a space among the three semiconductor laser bodies 1 of the array type semiconductor laser 100 according to the first embodiment so that the columnar electrode 4 is in contact with the front surface electrodes 9 of the semiconductor laser bodies 1. In this insertion, since the size of the columnar electrode 4 is set as described above, the columnar electrode 4 does not stick out beyond the laser facets, whereby the emitted laser light is not disturbed.

Then, the folded submount 3 is soldered to the stem 6 using PbSn alloy solder 22 having a melting point of 180° to 200°. Finally, as occasion demands, a cover (not shown) including a spherical lens is fitted, thereby completing an array type semiconductor laser device 200.

A description is given of the function.

In the array type semiconductor laser device 200 according to the second embodiment of the invention, when a voltage is applied between the columnar electrode 4 and the stem 6 of the stem 60 with the columnar electrode through the electrodes 7 and 8, a current flows from the electrode 7 into the front surface electrodes 9 of all semiconductor laser bodies 1 through the columnar electrode 4. The current which reaches the rear surface electrodes of the laser bodies 1 flows into the electrode 8 through the submount 3 comprising an FeNi alloy and the stem 6. In this way, the current is supplied in parallel to the semiconductor laser bodies 1, whereby the laser bodies 1 emit light. In this emission, since the emitting points of the semiconductor laser bodies 1 are disposed at positions constituting the sides of the triangle, close to each other, as described for the first embodiment, the laser light emitted from the three semiconductor laser bodies 1 can be concentrated into the region R shown in the figure. Therefore, the emitting region can be small, compared with the prior device shown in FIG. 8(a) in which the laser bodies 1 are aligned transversely. In this second embodiment, unlike the prior device shown in FIG. 8(b) in which the laser bodies 1 are laminated vertically, the semiconductor laser bodies 1 can be electrically connected in parallel, resulting in the array type semiconductor laser device without a limit of the supply voltage. Further, since the laser bodies 1 are not vertically laminated but are disposed on the sides of a polygon slippage of the elements in an optical axis direction which is caused when the semiconductor laser bodies 1 are laminated and damage due to heat in the adhering process can be reduced. Even when the number of the semiconductor laser bodies 1 increases, it is not necessary to increase the kinds of solder in the fabricating process as when the laser bodies 1 are laminated vertically. In addition to these advantages, in the second embodiment of the invention, since a current is supplied to all semiconductor laser bodies 1 using one columnar electrode 4, the fabricating process can be simpler than when the wires are connected to the respective laser bodies 1.

As described above, in the array type semiconductor laser device and the fabricating method thereof according to the second embodiment of the invention, after a plurality of semiconductor lasers 1 each having the front surface electrode 9 over the entire surface of the uppermost layer and having a structure in which a current flows in a direction perpendicular to the surface of the submount 3 are mounted on the submount 3 which can be folded, the submount 3 is folded so that all front surface electrodes 9 of the semiconductor laser bodies 1 touch internally one columnar electrode 4 which is insulated from the stem 6, thereby forming the array type semiconductor laser. Then, both ends of the folded submount 3 are adhered to each other, and the columnar electrode 4 of the stem 60 with the columnar electrode is inserted into a space formed among the three semiconductor laser bodies 1, thereby fitting to the array type semiconductor laser, resulting in the array type semiconductor laser device 200. Therefore, the array type semiconductor laser device, in which, in addition to the effects in the first embodiment, a current is supplied to all semiconductor laser bodies 1 using one columnar electrode 4 and the fabricating process is simpler than when the wirings are connected to the respective laser bodies 1, can be produced.

[Embodiment 3]

A description is given of an array type semiconductor laser device according to a third embodiment of the present invention.

In the third embodiment of the invention, in the array type semiconductor laser device having the structure shown in FIGS. 2(b) and 2(c) according to the second embodiment, materials of the columnar electrode 4 shown in FIGS. 2(a)–2(c) and the front surface electrodes 9 of the semiconductor laser bodies 1 are appropriately chosen, and the columnar electrode 4 and the front surface electrode 9 touch each other. Then, its temperature is raised and these are alloyed to melt a solder having the low melting point, whereby the electrical connections between the columnar electrode 4 and the semiconductor laser bodies 1 are made more reliable.

A description is given of the fabricating method.

In this third embodiment, a stem 60 with a columnar electrode in which Sn is used as a material of the columnar electrode 4 is fabricated and, using the semiconductor laser bodies 1 in which Au is used as a material of the front surface electrodes 9, an array type semiconductor laser 100 is fabricated. Then, the array type semiconductor laser 100 having the front surface electrodes 9 comprising Au and formed as in the first embodiment is mounted on the stem 6 having the columnar electrode 4 comprising Sn. At this time, all front surface electrodes 9 of the semiconductor laser bodies 1 touch internally the columnar electrode 4 as shown in FIGS. 2(b) and 2(c). By warming these materials, the temperature is raised and they are alloyed and adhered. Then, the stem 6 and the submount 3 are adhered to each other using PbSn alloy solder 22 having a melting point of 180° to 200°.

A description is given of the function.

In the fabricating process, the array type semiconductor laser 100 is mounted on the stem 60 with the columnar electrode so that all front surface electrodes 9 of the semiconductor laser bodies 1 touch internally the columnar electrode 4, and the temperature is raised. Due to this rise in the temperature, for example, when an alloy comprising Au (80%) and Sn (20%) is formed at portions where the front surface electrodes 9 and the columnar electrode 4 touch each other internally, the melting point of the alloy becomes about 280° C., whereby solder having melting point appropriate for practical use can be obtained. Consequently, the electrical connection between the columnar electrode 4 and the front surface electrodes 9 can be made more reliable.

As described above, in the third embodiment of the invention, materials of the columnar electrode 4 and the front surface electrodes 9 are appropriately chosen and, by raising the temperature and alloying, the columnar electrode 4 and the front surface electrode 9 are adhered to each other. Therefore, in addition to the effects of the second embodiment, the columnar electrode 4 and the front surface electrodes 9 can be soldered without preparing new solder, whereby the adhesion of the columnar electrode 4 and the front surface electrodes 9 of the semiconductor laser bodies 1 can be made more reliable.

[Embodiment 4]

In a fourth embodiment of the present invention, a conductive ball 10 as a common electrode is provided at the front surface electrodes 9 of a plurality of semiconductor laser bodies 1.

Figure 3:
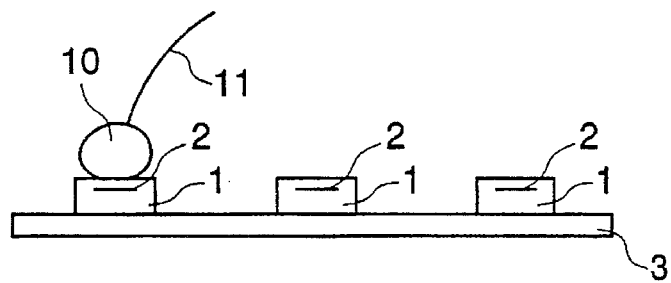
FIGS. 3(a) and 3(b) are sectional views illustrating process steps in a method of fabricating an array type semiconductor laser device and FIG. 3(c) is a perspective view illustrating a stem with a leading electrode used in the array type semiconductor laser device, in accordance with a fourth embodiment of the present invention.
Figure 3:
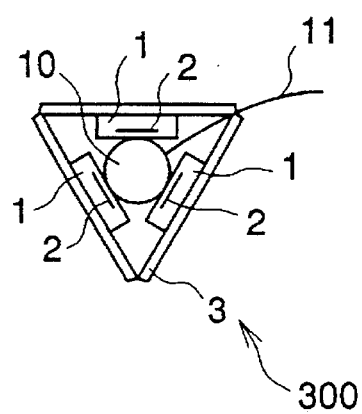
Figure 3:
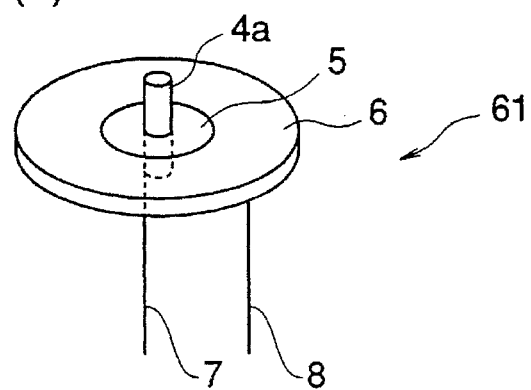

FIGS. 3(a) and 3(b) are sectional views illustrating process steps during a fabricating process of an array type semiconductor laser device according to the fourth embodiment of the invention, and FIG. 3(c) is a perspective view illustrating a stem with a leading electrode used in this fourth embodiment.

In FIGS. 3(a)–3(c), reference numeral 10 designates a conductive ball, i.e., sphere, comprising such as Au, and a wire 11 is connected to the conductive ball 10. The wiring 11 is connected to a leading electrode 4a. A stem 61 with a leading electrode has the stem 6 which is insulated from the electrode 4a by the insulator 5. The semiconductor laser body 1 and the submount 3 according to this fourth embodiment are the same as in the first embodiment, and the same reference numerals as in FIGS. 1(a)–1(b) and 2(a)–2(c) designate the same or corresponding parts.

The diameter of the conductive ball 10 is a little larger than the diameter 2r which is obtained from the formula (1) shown in the second embodiment.

A description is given of the fabricating method.

As described in the first embodiment of the invention, the semiconductor laser bodies 1 are soldered to the submount 3 using AuSi alloy solder 20 having a melting point of 380° to 410°. The conductive ball 10 which has the desired diameter and to which the wire 11 is connected is bonded to the front surface electrode 9 of the one of the semiconductor laser bodies 1 which are soldered. Thereafter, the submount 3 is folded so that the front surface electrodes 9 of the other semiconductor laser bodies 1 are in contact with the conductive ball 10. Then, both ends of the folded submount 3 are adhered to each other using AuSn alloy solder 21 having a melting point of 240° to 340°, thereby forming an array type semiconductor laser 300. In addition, when the front surface electrodes 9 of the semiconductor laser bodies 1 and the conductive ball 10 are adhered after the submount 3 is folded, the ball 10 is warmed up by ultrasonic waves and adhered, resulting in the array type semiconductor laser 300 in which the conductive ball 10 serves as a common electrode at the front surface side. Then, the wire 11 which is connected to the conductive ball 10 is connected to the leading electrode 4a of the stem 61 with the lead shown in FIG. 3(c), and the array type semiconductor laser 300 is soldered to the stem 6 using PbSn alloy solder 22 having a melting point of 180° to 200° as described for the second embodiment. Finally, as occasion demands, a cover (not shown) including a spherical lens is fitted, thereby completing an array type semiconductor laser device.

A description is given of the function.

In the array type semiconductor laser 300 according to the fourth embodiment of the invention, when a voltage is applied between the leading electrode 4a and the stem 6 of the stem 61 with the leading electrode through the electrodes 7 and 8, a current flows from the electrode 7 into the front surface electrodes 9 of all semiconductor laser bodies 1 through the wire 11 and the conductive ball 10. The current which reaches the rear surface electrodes of the laser bodies 1 flows into the electrode 8 through the submount 3 comprising an FeNi alloy and the stem 6. In this way, a current is supplied in parallel to the semiconductor laser bodies 1, whereby the laser bodies 1 emit light. In this emission, since the emitting points of the semiconductor laser bodies 1 are disposed at positions constituting the sides of the triangle, close to each other, as described in the first embodiment, the laser light emitted from the three semiconductor laser bodies 1 can be concentrated into the region R shown in the figure. Therefore, the emitting region can be small, compared with the prior device shown in FIG. 8(a) in which the laser bodies 1 are aligned transversely. In this fourth embodiment, unlike the prior device shown in FIG. 8(b) in which the laser bodies 1 are laminated vertically, the semiconductor laser bodies 1 can be electrically connected in parallel, resulting in the array type semiconductor laser device without a limit of the supply voltage. Further, since the laser bodies 1 are not vertically laminated but are disposed on the sides of a polygon, slippage of the elements in an optical axis direction which is caused when the semiconductor laser bodies 1 are laminated and damage due to the heat in the adhering process can be reduced. Even when the number of the semiconductor laser bodies 1 increases, it is not necessary to increase the kinds of solder in the fabricating process as when the laser bodies 1 are laminated vertically. In addition to these, in the fourth embodiment of the invention, since a current is supplied to all semiconductor laser bodies 1 using one wire 11, the fabricating process can be simpler than when the wirings are connected to the respective laser bodies 1 as in the first embodiment. Also, since the diameter of the conductive ball 10 is a little larger than that of the columnar electrode 4 shown in the second embodiment and the ball 10 comprises a soft material such as Au, the conductive ball 10 is deformed due to the larger diameter, whereby more reliable connection is made possible. Further, when the front surface electrodes 9 of the semiconductor laser bodies 1 and the conductive ball 10 are adhered to each other after the submount 3 is folded, since the ball 10 is warmed up by ultrasonic waves and adhered, more reliable adhesion can be realized.

As described above, in the array type semiconductor laser device and the fabricating method thereof according to the fourth embodiment of the invention, after a plurality of semiconductor laser bodies 1 each having the front surface electrode 9 over the entire surface of the uppermost layer and having a structure in which a current flows in a direction perpendicular to the surface of the submount 3 are mounted on the submount 3 which can be folded, the submount 3 is folded so that all front surface electrodes 9 of the semiconductor laser bodies 1 touch internally the conductive ball 10 to which the wire 11 is connected, both ends of the folded submount 3 are adhered to each other, the wire 11 is connected to the leading electrode 4a, and the submount 3 is adhered to the stem 6. Therefore, the array type semiconductor laser device, in which, in addition to the effects of the first embodiment, a current is supplied to all semiconductor laser bodies 1 using the wire 11 which is connected to the conductive ball 10 and the fabricating process is simpler than when the wire are connected to the respective laser bodies 1, can be obtained.

[Embodiment 5]

A description is given of an array type semiconductor laser device according to a fifth embodiment of the present invention.

Figure 4:
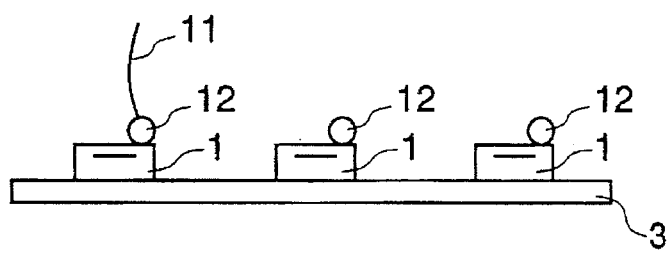
FIGS. 4(a) and 4(b) are sectional views illustrating process steps in a method of fabricating an array type semiconductor laser device in accordance with a fifth embodiment of the present invention.
Figure 4:
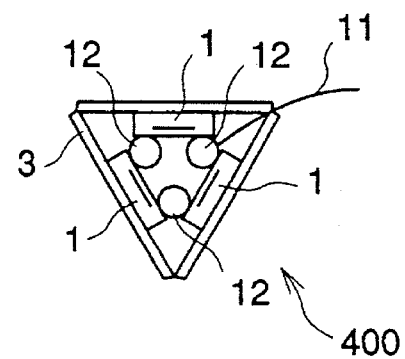

FIGS. 4(a) and 4(b) are sectional views illustrating process steps during a fabricating process of the array type semiconductor laser device according to the fifth embodiment of the invention.

In FIGS. 4(a) and 4(b), reference numeral 12 designates an electrically conductive ball smaller than that in the fourth embodiment, and a wire 11 is connected one of the conductive balls 12. The semiconductor laser body 1, the submount 3, and the wire 11 according to this fifth embodiment are the same as in the fourth embodiment, and the same reference numerals as in FIGS. 1(a)–1(b), 2(a)–2(c), and 3(a)–3(c) designate the same or corresponding parts.

A description is given of the fabricating method.

As described for the first embodiment of the invention, the semiconductor laser bodies 1 are soldered to the submount 3 using AuSi alloy solder 20 having a melting point of 380° to 410°. Each conductive ball 12 is bonded to one of the end portions of the front surface electrodes 9, and a wire 11 is connected to one of the conductive balls 12. Thereafter, the submount 3 is folded so that the facing front surface electrodes 9 of the adjacent semiconductor laser bodies 1 are in contact with each conductive ball 12. Then, both ends of the folded submount 3 are adhered to each other using AuSn alloy solder 21 having a melting point of 240° to 340°, thereby forming an array type semiconductor laser 400. In addition, when the front surface electrodes 9 of the semiconductor laser bodies 1 and the conductive balls 12 are adhered after the submount 3 is folded, the balls 12 are warmed up by ultrasonic waves and adhered, resulting in the array type semiconductor laser 400 in which the conductive balls 12 serve as a common electrode at the front surface side. Then, the wire 11 which is connected to the conductive ball 12 is connected to the leading electrode 4a of the stem 61 with the electrode shown in FIG. 3(c), and the array type semiconductor laser 400 is soldered to the stem 6 using PbSn alloy solder 22 having a melting point of 180° to 200° as described for the second embodiment. Finally, as occasion demands, a cover (not shown) including a spherical lens is fitted, thereby completing an array type semiconductor laser device.

A description is given of the function.

In the array type semiconductor laser 400 according to the fifth embodiment of the invention, when a voltage is applied between the leading electrode 4a and the stem 6 of the stem 61 with the leading electrode through the electrodes 7 and 8, a current flows from the electrode 7 into the front surface electrodes 9 of all semiconductor laser bodies 1 through the wire 11 and the conductive balls 12. The current which reaches the rear surface electrodes of the laser bodies 1 flows into the electrode 8 through the submount 3 comprising an FeNi alloy and the stem 6. In this way, a current is supplied in parallel to the semiconductor laser bodies 1, whereby the laser bodies 1 emit light, thereby reducing the size of a region where the laser light is emitted similar to the function in the first embodiment. Therefore, the emitting region can be small, compared with the prior device shown in FIG. 8(a) in which the laser bodies 1 are aligned transversely. In this fifth embodiment, unlike the prior device shown in FIG. 8(b) in which the laser bodies 1 are laminated vertically, the semiconductor laser bodies 1 can be electrically connected in parallel, resulting in the array type semiconductor laser device without a limit of the supply voltage. Further, since the laser bodies 1 are not vertically laminated but are disposed on the sides of a polygon, slippage of the elements in an optical axis direction which is caused when the semiconductor laser bodies 1 are laminated and damage due to the heat in the adhering process can be reduced. Even when the number of the semiconductor laser bodies 1 increases, it is not necessary to increase the kinds of solder in the fabricating process as when the laser bodies 1 are laminated vertically. In addition to these advantages, in the fifth embodiment of the invention, since a current is supplied to all semiconductor laser bodies 1 using one wire 11, the fabricating process can be simpler than when the wires are connected to the respective laser bodies 1 as in the first embodiment.

As described above, in the array type semiconductor laser device and the fabricating method according to the fifth embodiment of the invention, after a plurality of semiconductor laser bodies 1 each having the front surface electrode 9 over the entire surface of the uppermost layer and having a structure in which a current flows in a direction perpendicular to the surface of the submount 3 are mounted on the submount 3 which can be folded, each conductive ball 12 is bonded to one of the end portions of the front surface electrodes 9 and the wire 11 is connected to one of the conductive balls 12. The submount 3 is folded so that the facing front surface electrodes 9 of the adjacent semiconductor laser bodies 1 are in contact with the same conductive ball 12, both ends of the folded submount 3 are adhered to each other, the wire 11 is connected to the leading electrode 4a, and the submount 3 is adhered to the stem 6. Therefore, the array type semiconductor laser device, in which, in addition to the effects of the first embodiment, a current is supplied to all semiconductor laser bodies 1 using the wire 11 which is connected to the conductive ball 12 and the fabricating process is simpler than when the wires are connected to the respective laser bodies 1, can be obtained.

[Embodiment 6]

A description is given of an array type semiconductor laser device according to a sixth embodiment of the present invention.

Figure 5:
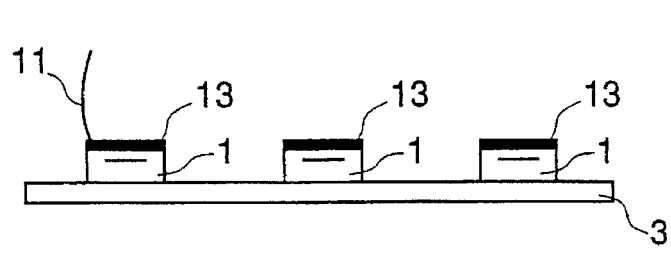
FIGS. 5(a) and 5(b) are sectional views illustrating process steps in a method of fabricating an array type semiconductor laser device in accordance with a sixth embodiment of the present invention.
Figure 5:
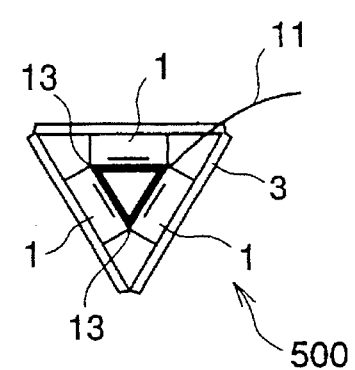

FIGS. 5(a) and 5(b) are sectional views illustrating process steps during a fabricating process of the array type semiconductor laser device according to the sixth embodiment of the invention.

In FIGS. 5(a) and 5(b), electrodes 13 are made thicker on the whole than the front surface electrodes 9 of the semiconductor laser bodies 1 in the previously described embodiments so as to have heights sufficient to be adhered to each other when the submount 3 is to be folded. The semiconductor laser body 1 and the submount 3 according to this sixth embodiment are the same as in the first embodiment, and the same reference numerals as in the first embodiment designate the same or corresponding parts.

A description is given of the fabricating method.

In this sixth embodiment of the invention, electrodes 13 comprising the front surface electrodes of a plurality of semiconductor laser bodies 1 which are thick are used. As shown in the first embodiment of the invention, the semiconductor laser bodies 1 are soldered to the submount 3 using AuSi alloy solder 20 having a melting point of 380° to 410°. The wire 11 is bonded to one of the electrodes 13 of the semiconductor laser bodies 1. Thereafter, the submount 3 is folded so that the adjacent electrodes 13 of the semiconductor laser bodies 1 are in contact with each other. Then, the ends of the folded submount 3 are adhered to each other using AuSn alloy solder 21 having a melting point of 240° to 340°, thereby forming an array type semiconductor laser 500. Then, the wire 11 which is connected to the electrode 13 is connected to the leading electrode 4a of the stem 61 with the leading electrode shown in FIG. 3(c), and the array type semiconductor laser 500 is soldered to the stem 6 using PbSn alloy solder 22 having a melting point of 180° to 200° as described for the second embodiment. Finally, as occasion demands, a cover (not shown) including a spherical lens is fitted, thereby completing an array type semiconductor laser device.

A description is given of the function.

In the array type semiconductor laser 500 according to the sixth embodiment of the invention, when a voltage is applied between the leading electrode 4a and the stem 6 of the stem 61 with the leading electrode through the electrodes 7 and 8, a current flows from the electrode 7 into all semiconductor laser bodies 1 through the wire 11 and the electrodes 13. The current which reaches the rear surface electrodes of the laser bodies 1 flows into the electrode 8 through the submount 3 comprising an FeNi alloy and the stem 6. In this way, a current is supplied in parallel to the semiconductor laser bodies 1, whereby the laser bodies 1 emit light, thereby reducing the size of a region where the laser light is emitted as in the first embodiment. Therefore, the emitting region can be small, compared with the prior device shown in FIG. 8(a) in which the laser bodies 1 are aligned transversely. In this sixth embodiment, unlike the prior device shown in FIG. 8(b) in which the laser bodies 1 are laminated vertically, the semiconductor laser bodies 1 can be electrically connected in parallel, resulting in the array type semiconductor laser device without a limit of the supply voltage. Further, since the laser bodies 1 are not vertically laminated but are disposed on the sides of a polygon, slippage of the elements in an optical axis direction which is caused when the semiconductor laser bodies 1 are laminated and damage due to the heat in the adhering process can be reduced. Even when the number of the semiconductor laser bodies 1 increases, it is not necessary to increase the kinds of solder in the fabricating process as when the laser bodies 1 are laminated vertically. In addition to these advantages, in the sixth embodiment of the invention, since a current is supplied to all semiconductor laser bodies 1 using one wire 11, the fabricating process can be simpler than when the wires are connected to the respective laser bodies 1 as in the first embodiment.

As described above, in the array type semiconductor laser device and the fabricating method thereof according to the sixth embodiment of the invention, after a plurality of semiconductor laser bodies 1 each having the electrode 13 thicker over the entire surface of the uppermost layer and having a structure in which a current flows in a direction perpendicular to the surface of the submount 3 are mounted on the submount 3, the wire 11 is connected to one of the electrodes 13 of the semiconductor laser bodies 1, the submount 3 is folded so that the adjacent electrodes 13 of the semiconductor laser bodies 1 are in contact with each other, the ends of the folded submount 3 are adhered to each other, the wire 11 is connected to the leading electrode 4a, and the submount 3 is adhered to the stem 6. Therefore, the array type semiconductor laser device, in which, in addition to the effects of the first embodiment, a current is supplied to all semiconductor laser bodies 1 through the wire 11 and the electrodes 13 which are connected to each other and the fabricating process is simpler than when the wires are connected to the respective laser bodies 1, can be obtained.

[Embodiment 7]

A description is given of a seventh embodiment of the present invention.

Figure 6:
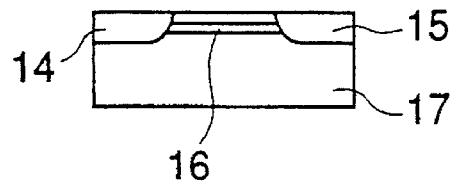
FIG. 6(a) is a sectional view illustrating a semiconductor laser body having an n type electrode and a p type electrode on the surface.
FIGS. 6(b) and 6(c) are sectional views illustrating process steps in a method of fabricating an array type semiconductor laser device including the semiconductor laser bodies.
FIG. 6(d) is a perspective view illustrating a stem with a leading electrode used in the array type semiconductor laser device, in accordance with a seventh embodiment of the present invention.
Figure 6:
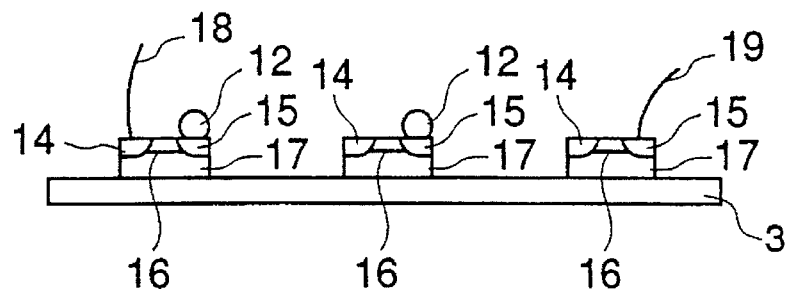
Figure 6:
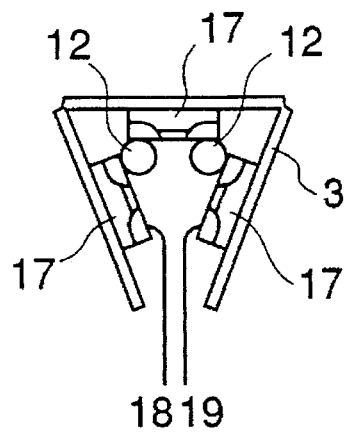
Figure 6:
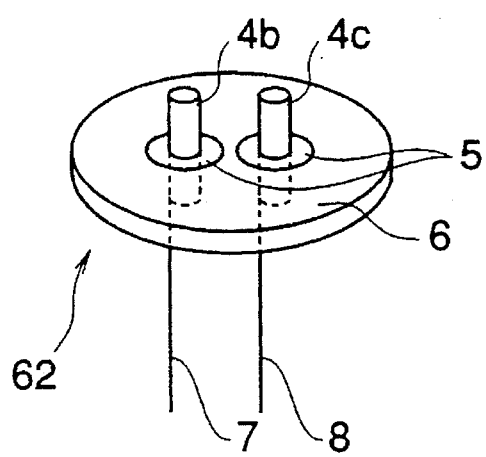

FIG. 6(a) is a sectional view illustrating a semiconductor laser body used for realizing the seventh embodiment of the invention, FIG. 6(b) is a sectional view illustrating the semiconductor laser bodies which are mounted on a submount, FIG. 6(c) is a sectional view illustrating a process during fabricating an array type semiconductor laser, and FIG. 6(d) is a perspective view illustrating a stem with leading electrodes on which the fabricated array type semiconductor laser is mounted.

In FIGS. 6(a)–6(d), reference numeral 17 designates a semiconductor laser body, numeral 16 designates an active layer, and numerals 4b and 4c designate leading electrodes. Wires 18 and 19 are connected to an n type (p type) region 14 and a p type (n type) region 15, respectively.

This semiconductor laser body 17 has positive and negative front surface electrodes at opposite ends of an uppermost layer and has a structure in which a current flows in a direction parallel to the surface of the submount 3.

A description is given of the fabricating method.

In this seventh embodiment of the invention, as shown in the first embodiment of the invention, the semiconductor laser bodies 17 are soldered to the submount 3 using AuSi alloy solder 20 having the melting point of 380° to 410°. At this time, the semiconductor laser bodies 17 are disposed so that the polarities of the facing front surface electrodes of the adjacent laser bodies 17 are different from each other, i.e., a current flows through the semiconductor laser bodies 17 in the same direction from left to right (from right to left). Then, a conductive ball 12 as large as that used in the fifth embodiment is bonded to each of the front surface electrodes of the n type and p type regions 14 and 15 and the conductive balls 12 are not bonded to the two front surface electrodes of the n type region 14 and the p type region 15 which are at opposite ends of the submount 3 but the wires 18 and 19 are connected thereto, respectively. Thereafter, the submount 3 is folded so that the front surface electrodes of the facing n type and p type regions 14 and 15 of the adjacent semiconductor laser bodies 17 are in contact with each conductive ball 12 and the two front surface electrodes of the n type region 14 and the p type region 15 which are at opposite ends of the submount 3 and to which the wirings 18 and 19 are connected are not short-circuited to each other. Then, the ends of the folded submount 3 are adhered to each other using AuSn alloy solder 21 having a melting point of 240° to 340°, thereby forming an array type semiconductor laser 600. In this array type semiconductor laser, the semiconductor laser bodies 17 can be connected in series through the conductive balls 12. Then, the wirings 18 and 19 which are at the ends of the submount 3 and are connected to the front surface electrodes of the n type region 14 and the p type region 15 are connected to the leading electrodes 4b and 4c shown in FIG. 6(d), respectively, and the array type semiconductor laser is soldered to the stem 6 using PbSn alloy solder 22 having a melting point of 180° to 200° as described for the second embodiment. Finally, as occasion demands, a cover (not shown) including a spherical lens is fitted, thereby completing an array type semiconductor laser device.

A description is given of the function.

In the array type semiconductor laser according to the seventh embodiment of the invention, the wires 18 and 19 are connected to the leading electrodes 4b and 4c of the stem 62 with the leading electrodes, respectively. When a voltage is applied between the electrodes 7 and 8, a current is successively supplied in series from the electrode 8 into all semiconductor laser bodies 17 through the leading electrode 4c and the wiring 19. Further, the current flows through the wiring 18 and the leading electrode 4b. In this way, a current is supplied in series to the semiconductor laser bodies 17, whereby the laser bodies 17 emit light, thereby reducing the size of a region where the laser light is emitted. Also, unlike the prior device shown in FIG. 8(a) in which the laser bodies 17 are aligned transversely, the semiconductor laser bodies 17 can be electrically connected in series, resulting in the array type semiconductor laser device without a limit of the supply current. Further, since the laser bodies 17 are not vertically laminated but are disposed on the sides of a polygon, slippage of the elements in an optical axis direction which is caused when the semiconductor laser bodies 17 are laminated and damage due to the heat in the adhering process can be reduced. Even when the number of the semiconductor laser bodies 17 increases, it is not necessary to increase the kinds of solder in the fabricating process as when the laser bodies 17 are laminated vertically.

As described above, in the array type semiconductor laser device and the fabricating method thereof according to the seventh embodiment of the invention, a plurality of semiconductor laser bodies 17 each having positive and negative front surface electrodes at ends of the uppermost layer and having a structure in which a current flows in a direction parallel to the surface of the submount 3 are prepared, the semiconductor laser bodies 17 are mounted on the submount 3 so that the polarities of the facing front surface electrodes of the adjacent laser bodies 17 are different from each other, each conductive ball 12 is bonded to one of the facing front surface electrodes and the wires 18 and 19 are connected to the two front surface electrodes which are at opposite ends of the submount 3, the submount 3 is folded so that the facing front surface electrodes having different polarities are connected to each other through the conductive balls 12 and the two front surface electrodes to which the wirings 18 and 19 are connected are not short-circuited to each other, the ends of the folded submount 3 are adhered to each other, the wires 18 and 19 are connected to the leading electrodes 4b and 4c, respectively, and the submount 3 is soldered to the stem 6. Therefore, as compared with the prior device shown in FIG. 8(a) in which the laser bodies 1 are aligned transversely, the emitting region can be small and the semiconductor laser bodies 17 can be electrically connected in series, resulting in the array type semiconductor laser device without a limit of the supply current. In addition, as compared with the prior device shown in FIG. 8(b) in which the laser bodies 1 are laminated vertically, it is not necessary to increase the kinds of solder in the fabricating process even when the number of laser bodies 17 increases and slippage of the elements in an optical axis direction which is caused when the semiconductor laser bodies 17 are laminated and damage due to the heat in the adhering process can be reduced. Further, when there is a limitation in the structure of the power supply according to uses for this array type semiconductor laser device, i.e., when there is a limit in the supply current or the supply voltage, the array type semiconductor laser device which can have the same external form and can avoid the limit by selecting any of the first to sixth embodiments and this seventh embodiment is obtained, whereby the laser device can have more uses.

[Embodiment 8]

A description is given of an eighth embodiment of the present invention.

Figure 7:
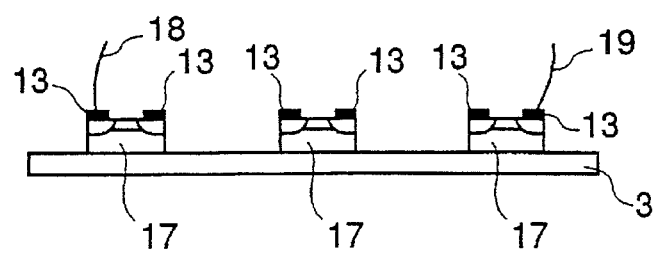
FIGS. 7(a) and 7(b) are sectional views illustrating process steps in a method of fabricating an array type semiconductor laser device in accordance with an eighth embodiment of the present invention.
Figure 7:
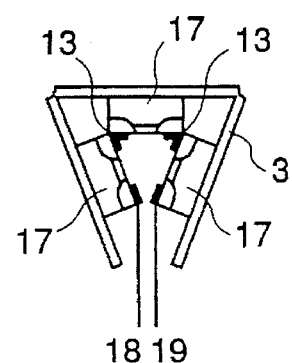

FIG. 7(a) is a sectional view illustrating semiconductor laser bodies which are mounted on the submount, of which laser bodies front surface electrodes are made thicker than those of the semiconductor laser bodies 17 shown in FIG. 6(a), and FIG. 7(b) is a sectional view illustrating a process during fabricating an array type semiconductor laser similar to the process of the first embodiment.

In FIGS. 7(a) and 7(b), reference numeral 13 designates an electrode thicker on the n type or p type region as in the sixth embodiment of the invention, and the same reference numerals as in the sixth embodiment designate the same or corresponding parts.

A description is given of the fabricating method.

In this eighth embodiment of the invention, as shown in the first embodiment of the invention, the semiconductor laser bodies 17 are soldered to the submount 3 using AuSi alloy solder 20 having a melting point of 380° to 410°. At this time, the semiconductor laser bodies 17 are disposed so that the polarities of the facing front surface electrodes of the adjacent laser bodies 17 are different from each other, i.e., a current flows through the semiconductor laser bodies 17 in the same direction from left to right (from right to left). Then, the wires 18 and 19 are connected to the two front surface electrodes 13 of the n type region 14 and the p type region 15 which are at opposite ends of the submount 3, respectively. Thereafter, the submount 3 is folded so that the front surface electrodes 13 of the facing n type and p type regions 14 and 15 of the adjacent semiconductor laser bodies 17 are in contact with each other and the two front surface electrodes 13 of the n type region 14 and the p type region 15 which are at opposite ends of the submount 3 and to which the wires 18 and 19 are connected are not short-circuited to each other. Then, the ends of the folded submount 3 are adhered to each other using AuSn alloy solder 21 having a melting point of 240° to 340°, thereby forming an array type semiconductor laser. In this array type semiconductor laser, the semiconductor laser bodies 17 can be connected in series through the electrodes 13. Then, the wires 18 and 19 which are at the ends of the submount 3 and are connected to the front surface electrodes 13 of the n type region 14 and the p type region 15 are connected to the leading electrodes 4b and 4c shown in FIG. 6(d), respectively, and the array type semiconductor laser is soldered to the stem 6 using PbSn alloy solder 22 having a melting point of 180° to 200° as in the second embodiment. Finally, as occasion demands, a cover (not shown) including a spherical lens is fitted, thereby completing an array type semiconductor laser device.

A description is given of the function.

In the array type semiconductor laser according to the eighth embodiment of the invention, the wires 18 and 19 are connected to the leading electrodes 4b and 4c of the stem 62 with the leading electrodes, respectively. When a voltage is applied between the electrodes 7 and 8, a current is successively supplied in series from the electrode 8 into all semiconductor laser bodies 17 through the leading electrode 4c and the wire 19. Further, the current flows through the wiring 18 and the leading electrode 4b. In this way, a current is supplied in series to the semiconductor laser bodies 17, whereby the laser bodies 17 emit light, thereby reducing the size of a region where the laser light is emitted. Also, unlike the prior device shown in FIG. 8(a) in which the laser bodies 17 are laminated vertically, the semiconductor laser bodies 17 can be electrically connected in series, resulting in the array type semiconductor laser device without a limit of the supply current. Further, unlike the prior device shown in FIG. 8(b) in which the laser bodies 17 are aligned transversely, since the laser bodies 17 are disposed on the sides of a polygon, slippage of the elements in an optical axis direction which is caused when the semiconductor laser bodies 17 are laminated and damage due to the heat in the adhering process can be reduced. Even when the number of the semiconductor laser bodies 17 increases, it is not necessary to increase kinds of the solder in the fabricating process as when the laser bodies 17 are laminated vertically.

As described above, in the array type semiconductor laser device and the fabricating method according to the eighth embodiment of the invention, a plurality of semiconductor laser bodies 17 each having the positive and negative front surface electrodes 13 thicker at both ends of the uppermost layer and having a structure in which a current flows in a direction parallel to the surface of the submount 3 are prepared, the semiconductor laser bodies 17 are mounted on the submount 3 so that the polarities of the facing front surface electrodes 13 of the adjacent laser bodies 17 are different from each other, the wires 18 and 19 are connected to the two front surface electrodes 13 which are at both ends of the submount 3, the submount 3 is folded so that the facing front surface electrodes 13 having different polarities are connected directly to each other and the two front surface electrodes 13 to which the wires 18 and 19 are connected are not short-circuited to each other, the ends of the folded submount 3 are adhered to each other, the wires 18 and 19 are connected to the leading electrodes 4b and 4c, respectively, and the submount 3 is soldered to the stem 6. Therefore, the array type semiconductor laser device which can achieve the same effects as the seventh embodiment, concentrate the light emitting points on a narrow region, and are connected in series is obtained.

Although in the first to eighth embodiments of the invention three semiconductor laser bodies 1 and 17 are used, semiconductor laser bodies 1 and 17 of an appropriate number more than three may be used.

In addition, in the seventh and eighth embodiments, the wires 18 and 19 are connected to the front surface electrodes which are at the ends of the submount 3. However, the wires 18 and 19 are connected not to the front surface electrodes which are at both ends but to the facing front surface electrodes having different polarities, and the front surface electrodes which are at the ends of the submount 3 may be connected to each other before the submount is folded.

What is claimed is:

1. A semiconductor laser array device comprising:
   a foldable submount having a length and a width and folded along a plurality of generally parallel lines transverse to the length to form, in cross-section, the shape of a regular polygon, the polygon having sides corresponding to respective surfaces of said folded submount; and
   a plurality of semiconductor lasers, each semiconductor laser having an uppermost layer and a lowermost layer, the lowermost layer of each semiconductor laser being mounted on a respective side of and inside the polygon.

2. The semiconductor laser array device of claim 1 wherein each of semiconductor lasers has a front surface electrode over the uppermost layer and a rear surface electrode over the lowermost layer and has a structure in which a current flows in a direction perpendicular to the corresponding surface of said submount.

3. The semiconductor laser array device of claim 2 including a central columnar electrode disposed within the polygon so that the front surface electrodes of all of said semiconductor lasers touch the columnar electrode.

4. The semiconductor laser array device of claim 3 wherein said front surface electrodes of said semiconductor lasers are soldered to said columnar electrode.

5. The semiconductor laser array device of claim 2 including an electrically conductive ball in contact with all of the front surface electrodes of said semiconductor lasers.

6. The semiconductor laser array device of claim 2 including:
   a plurality of electrically conductive balls electrically connecting the front surface electrodes of adjacent semiconductor lasers to each other; and
   a wire connected to one of said conductive balls.

7. The semiconductor laser array device of claim 2 wherein the front surface electrodes of adjacent semiconductor lasers directly contact and are thereby electrically connected to each other.

8. The semiconductor laser array device of claim 1 wherein each of said semiconductor lasers has positive and negative front surface electrodes on the uppermost layer so that current flows through each of said semiconductor lasers in directions parallel to the respective surfaces of said folded submount.

9. The semiconductor laser array device of claim 8 wherein said semiconductor lasers are disposed on said submount so that opposed front electrodes of adjacent semiconductor lasers have different polarities and including wires connected respectively to the two front surface electrodes of said semiconductor lasers disposed at opposite ends of said submount and having different polarities and a plurality of electrically conductive balls, wherein opposing front surface electrodes of adjacent semiconductor lasers are connected to each other through a respective one of said conductive balls and the two front surface electrodes to which the wires are connected are not short-circuited to each other.

10. The semiconductor laser array device of claim 8 wherein said semiconductor lasers are disposed on said submount so that opposed front electrodes of adjacent semiconductor lasers have different polarities and including wires connected respectively to the two front surface electrodes of said semiconductor lasers disposed at opposite ends of said submount and having different polarities wherein opposing front surface electrodes of adjacent semiconductor lasers are directly mechanically and electrically connected to each other and the two front surface electrodes to which the wires are connected are not short-circuited to each other.

11. The semiconductor laser array device of claim 1 wherein said plurality of semiconductor lasers comprises at least three semiconductor lasers.

12. A method of fabricating a semiconductor laser array device including:
   preparing a plurality of semiconductor lasers, each semiconductor laser having a front surface electrode over an entire surface of an uppermost layer and having a structure in which a current flows perpendicular to the uppermost layer;
   mounting the semiconductor lasers at respective spaced apart locations along a length of and on a foldable submount having opposite ends;
   folding the submount along a plurality of generally parallel lines transverse to the length of the submount so that all front surface electrodes of the respective semiconductor lasers touch a columnar electrode mechanically connected to and electrically insulated from a stem;
   adhering the ends of the folded submount to each other; and
   adhering the submount to the stem.

13. A method of fabricating a semiconductor laser array device including:
   preparing a plurality of semiconductor lasers, each semiconductor laser having a front surface electrode over an entire surface of an uppermost layer and having a structure in which a current flows perpendicular to the uppermost layer;
   mounting the semiconductor lasers at respective spaced apart locations along a length of and on a foldable submount having opposite ends;
   folding the submount along a plurality of generally parallel lines transverse to the length of the submount so that all front surface electrodes of the respective semiconductor lasers touch an electrically conductive ball from which a wires extends;
   adhering the ends of the folded submount to each other;
   connecting the wire to a leading electrode; and
   adhering the submount to a stem.

14. A method of fabricating a semiconductor laser array device including:
   preparing a plurality of semiconductor lasers, each semiconductor laser having a front surface electrode over an entire surface of an uppermost layer and having a structure in which a current flows perpendicular to the uppermost layer;
   mounting the semiconductor lasers at respective spaced apart locations along a length of and on a foldable submount having opposite ends;
   bonding a respective electrically conductive ball to one end of the front surface electrode of each adjacent pair of semiconductor lasers and connecting a wire to one of the conductive balls;
   folding the submount along a plurality of generally parallel lines transverse to the length of the submount so that the ends of opposing front surface electrodes of the adjacent pairs of semiconductor lasers are electrically connected to each other through a conductive ball;
   adhering the ends of the folded submount to each other;
   connecting the wire to a leading electrode; and
   adhering the submount to a stem.

15. A method of fabricating a semiconductor laser array device including:
   preparing a plurality of semiconductor lasers, each semiconductor laser having a front surface electrode over an entire surface of an uppermost layer and having a structure in which a current flows perpendicular to the uppermost layer;
   mounting the semiconductor lasers at respective spaced apart locations along a length of an on a foldable submount having opposite ends;
   connecting a wire to one of the front surface electrodes of one of the semiconductor lasers;
   folding the submount along a plurality of generally parallel lines transverse to the length of the submount so that the adjacent front surface electrodes of the semiconductor lasers are directly electrically and mechanical connected to each other;
   connecting the wire to a leading electrode; and
   adhering the submount to a stem.

16. A method of fabricating a semiconductor laser array device including:
   preparing a plurality of semiconductor lasers, each semiconductor laser having a front surface electrode over an entire surface of an uppermost layer and having a structure in which a current flows perpendicular to the uppermost layer;

mounting the semiconductor lasers at respective spaced apart locations along a length of and on a foldable submount so that opposing front surface electrodes of adjacent pairs of semiconductor lasers have opposite polarities;

bonding a respectively electrically conductive ball to one of each pair of opposing front surface electrodes and connecting wires to front surface electrodes of semiconductor lasers at opposite ends of the submount;

folding the submount along a plurality of generally parallel lines transverse to the length of the submount so that the adjacent opposing front surface electrodes are connected to each other through a conductive ball and the two front surface electrodes to which the wires are connected are not short-circuited to each other;

adhering the ends of the folded submount to each other;

connecting the wires to leading electrodes; and adhering the submount to a stem.

17. A method of fabricating a semiconductor laser array device including:

preparing a plurality of semiconductor lasers, each semiconductor laser having a front surface electrode over an entire surface of an uppermost layer and having a structure in which a current flows perpendicular to the uppermost layer;

mounting the semiconductor lasers at respective spaced apart locations along a length of and on a foldable submount so that facing front surface electrodes of adjacent semiconductor lasers have opposite polarities;

connecting respective wires to front surface electrodes of semiconductor lasers at opposite ends of the submount;

folding the submount along a plurality of generally parallel lines transverse to the length of the submount so that the adjacent opposing front surface electrodes are directly mechanically and electrically connected to each other and the two front surface electrodes to which the wires are connected are not short-circuited to each other;

adhering the ends of the folded submount to each other;

connecting the wires to leading electrodes; and adhering the submount to a stem.

* * * * *

UNITED STATES PATENT AND TRADEMARK OFFICE
CERTIFICATE OF CORRECTION

PATENT NO. : 5,648,977
DATED : July 15, 1997
INVENTOR(S) : MIYAZAKI

It is certified that error appears in the above-identified patent and that said Letters Patent is hereby corrected as shown below:

On the title page, and column 1, lines 1-2

Item 54, Title, change "LASER ARRAY DEVICE AND METHOD OF FABRICATING THE DEVICE" to --SEMICONDUCTOR LASER ARRAY DEVICE AND METHOD OF FABRICATING THE DEVICE--;

Column 20, Line 15, change "wires" to --wire --;

Column 20, Line 52, change "an" to --and--;

Column 20, Lines 59-60, change "mechanical" to --mechanically--.

Signed and Sealed this

Third Day of February, 1998

Attest:

BRUCE LEHMAN

Attesting Officer

Commissioner of Patents and Trademarks